United States Patent
Rock et al.

(10) Patent No.: US 8,990,034 B2
(45) Date of Patent: Mar. 24, 2015

(54) REDUNDANCY FOR IMPROVED STACK HEALTH MONITORING RELIABILITY

(75) Inventors: Jeffrey A. Rock, Fairport, NY (US); David J. Reed, Fairport, NY (US); Kenneth L. Kaye, Fairport, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 498 days.

(21) Appl. No.: 13/550,915

(22) Filed: Jul. 17, 2012

(65) Prior Publication Data

US 2014/0025320 A1 Jan. 23, 2014

(51) Int. Cl.
*G01R 31/36* (2006.01)
*G06F 19/00* (2011.01)
*H01M 8/04* (2006.01)

(52) U.S. Cl.
CPC ...... *H01M 8/04298* (2013.01); *H01M 8/04559* (2013.01); *H01M 8/04552* (2013.01); *H01M 8/04664* (2013.01); *G01R 31/362* (2013.01); *G01R 31/3679* (2013.01); *Y02E 60/50* (2013.01)
USPC ............. 702/58; 429/442; 429/433; 429/430; 429/428; 429/432; 429/467; 429/492; 324/72; 180/65.1

(58) Field of Classification Search
CPC ..................... H01M 8/04298; H01M 8/04559; H01M 8/04552; H01M 8/04664; G01R 31/362; G01R 31/3679; Y02E 60/50
USPC ............ 702/58; 429/442, 433, 430, 428, 432, 429/467, 492; 324/72; 180/65.1
See application file for complete search history.

(56) References Cited

U.S. PATENT DOCUMENTS

| | | | |
|---|---|---|---|
| 7,083,017 B2* | 8/2006 | Hasuka et al. | 180/65.1 |
| 7,292,042 B2* | 11/2007 | Morita et al. | 324/509 |
| 7,421,356 B2 | 9/2008 | Rea et al. | |
| 7,682,714 B2* | 3/2010 | Aoto et al. | 429/430 |
| 7,863,904 B2* | 1/2011 | Takeda et al. | 324/522 |
| 8,030,941 B2* | 10/2011 | Coenen | 324/434 |
| 8,206,862 B2* | 6/2012 | Zawisa et al. | 429/432 |
| 8,257,875 B2* | 9/2012 | Rea et al. | 429/432 |
| 2004/0144579 A1* | 7/2004 | Hasuka et al. | 180/65.3 |
| 2007/0008666 A1* | 1/2007 | Morita et al. | 361/42 |
| 2007/0154755 A1* | 7/2007 | Wardrop | 429/23 |
| 2007/0202371 A1* | 8/2007 | Takeda et al. | 429/23 |
| 2008/0191702 A1* | 8/2008 | Coenen | 324/434 |
| 2008/0238430 A1* | 10/2008 | Page et al. | 324/425 |
| 2011/0217612 A1* | 9/2011 | Zawisa et al. | 429/432 |
| 2011/0217613 A1* | 9/2011 | Rea et al. | 429/432 |

* cited by examiner

*Primary Examiner* — Carol S Tsai
(74) *Attorney, Agent, or Firm* — Dinsmore & Shohl LLP

(57) ABSTRACT

A health monitoring system for a fuel cell stack using current fuel cell architecture to enable the electronic control unit (ECU) to continue to monitor the health of the fuel cell stack despite a component failure. The system uses an embedded measurement module (EMM) connected to a group of fuel cells in the fuel cell stack to monitor the health of that group of fuel cells. The EMM produces a pulse width modulation signal that is sent to the ECU. A total voltage value for the group of fuel cells is embedded into the calibration signal or end of frame sequence. The ECU uses an algorithm to determine a missing voltage of at least one fuel cell in the event of the component failure of that fuel cell by adding up the cumulative value for each fuel cell reporting their voltage and subtracting that value from the total voltage value found in the end of frame sequence.

14 Claims, 3 Drawing Sheets

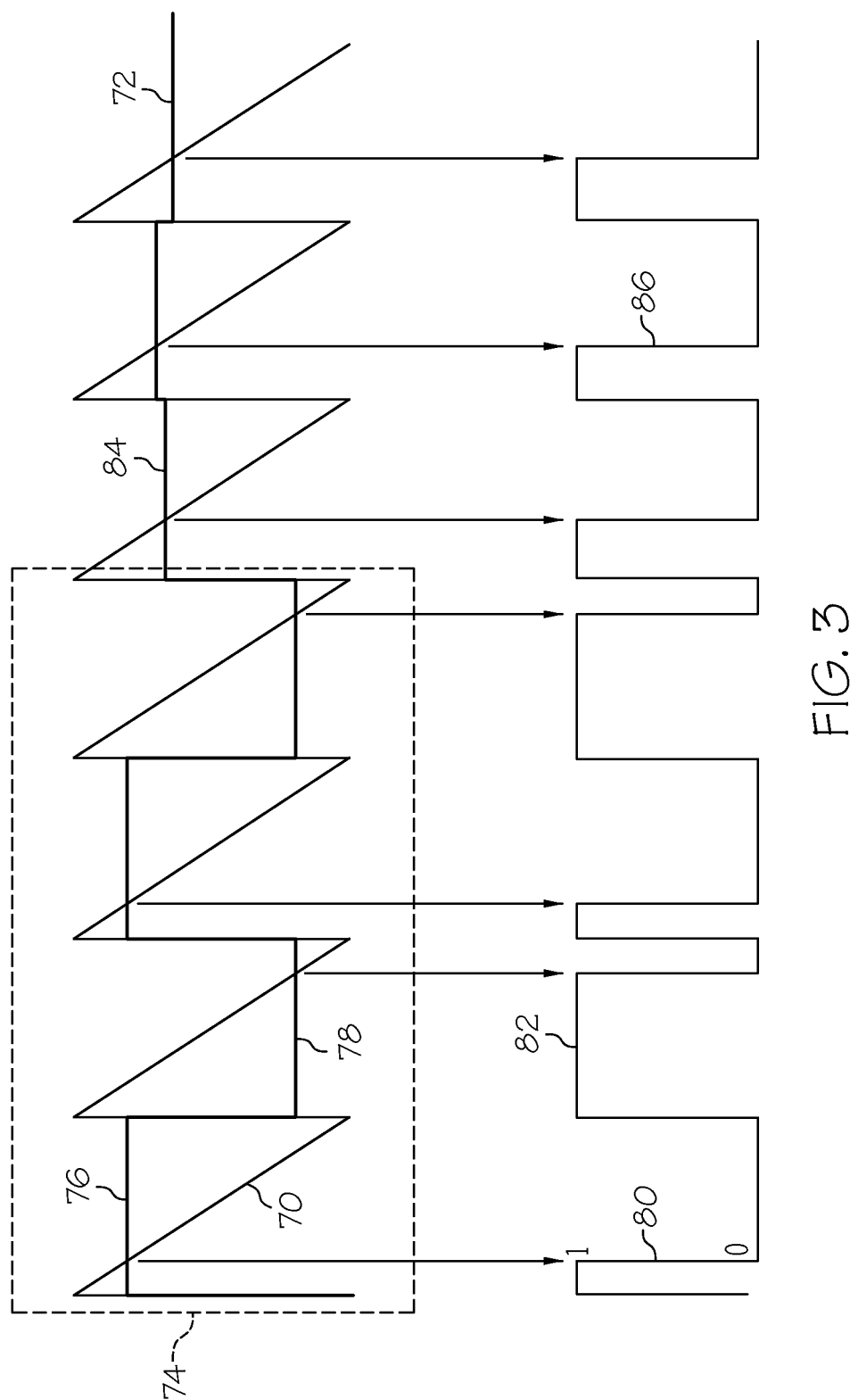

REDUNDANCY FOR IMPROVED STACK HEALTH MONITORING RELIABILITY

BACKGROUND OF THE INVENTION

The present invention relates generally to a method and apparatus for monitoring fuel cell voltages in a fuel cell stack, and more particularly to making connector and component failures in the monitoring circuitry transparent to the user without losing the information that the failed connector or component was designed to provide. Furthermore, the method and apparatus provide for a redundant power supply and ground connection for the monitoring circuitry measurements.

Fuel cells produce energy by the electrochemical processing of reactants and the subsequent generation of electric current. A typical fuel cell configuration includes a polymer membrane (e.g., a proton exchange membrane (PEM)) with catalyst layers on both sides to promote the respective oxidation and reduction of hydrogen and oxygen. Additional components, including a pair of gas diffusion media layers disposed against the respective catalyst layers and cathode and anode bipolar plates placed outside the gas diffusion media layers; these bipolar plates define flow channels therein to facilitate the introduction of the externally-provided reactants to the catalyst-coated PEM. The various components are compressed together to form the fuel cell. To increase the power output, numerous fuel cells are arranged together to form a fuel cell stack.

Fuel cell stacks are monitored for their electrical viability through a set of diagnostic connectors which are attached to the bipolar plates of each fuel cell within the fuel cell stack. An embedded measurement module (EMM), via the diagnostic connectors, monitors the voltage of each fuel cell and reports that health to the vehicle electronic control unit (ECU).

A problem with this approach is that the EMM is unable to address any failure modes that may arise, making the system vulnerable to diagnostic connector and component failures. Furthermore, if the diagnostic connector that powers the EMM fails, the EMM will not provide any information on any of the fuel cells to the vehicle ECU. A way is needed to circumvent those failures to get the needed data to monitor the health of the fuel stack.

SUMMARY OF THE INVENTION

In view of the above and other problems, the present disclosure modifies the end of frame sequence of the pulse width modulation (PWM) signal to provide a new data set to be used in calculating the voltage of each fuel cell connected to the EMM in the event of a connection or component failure. The role of the end of frame sequence is to provide a calibration signal and to indicate the beginning of a data stream. In the preferred embodiment, the end of frame sequence is modified to add a total voltage value of all the fuel cells connected to the EMM. In the event of a connection or component failure, the sum of all the fuel cell voltages reported are subtracted from the total voltage value to find the missing fuel cell voltage due to the failure. Furthermore, a redundant or alternate power and ground connection are added to the current EMM architecture to overcome a failure in the primary power or ground connection.

According to a first aspect of the present invention, a redundant health monitoring system is disclosed. The system uses an EMM with a cell voltage monitoring circuit and a plurality of diagnostic connectors. The plurality of diagnostic connectors are coupled to a substrate and electrically connected with a plurality of fuel cells in the fuel cell stack. The cell voltage monitoring circuit is configured to send a plurality of pulses and an end of frame sequence to a receiver circuit. Each pulse in the plurality of pulses corresponds to an individual voltage for an individual fuel cell in a plurality of fuel cells in the fuel cell stack. The end of frame sequence indicates the beginning of the plurality of pulses as well as a total voltage for the plurality of fuel cells connected to the EMM. A central processing unit with an algorithm programmed therein sums up the individual voltages and the sum is subtracted from the total voltage to determine a missing voltage of at least one fuel cell.

According to a second aspect of the present invention, a method of redundant health monitoring of a fuel cell stack is disclosed. The method entails providing an EMM that is electrically connected to a plurality of fuel cells in the fuel cell stack. The EMM sends out a plurality of pulses wherein each pulse in the plurality of pulses indicates an individual voltage for an individual fuel cell in a plurality of fuel cells in the fuel cell stack. An end of frame sequence is defined that indicates the beginning of the plurality of pulses, and a total voltage for the plurality of fuel cells connected to the embedded measurement module. A missing voltage value is calculated corresponding to at least one of the fuel cells in the fuel cell stack using an algorithm. The individual voltages for each fuel cell are added up to a sum of the individual voltages and the sum is subtracted from the total voltage to determine the missing voltage value.

According to a third aspect of the present invention, a redundant health monitoring system for a fuel cell stack is disclosed. The system uses an EMM with a cell voltage monitoring circuit and a plurality of diagnostic connectors. The plurality of diagnostic connectors are coupled to a substrate and electrically connected with a plurality of fuel cells in the fuel cell stack. The cell voltage monitoring circuit is configured to optically send a plurality of pulses and an end of frame sequence to a receiver circuit. Each pulse in the plurality of pulses corresponds to an individual voltage for an individual fuel cell in a plurality of fuel cells in the fuel cell stack. The end of frame sequence indicates the beginning of the plurality of pulses as well as a total voltage for the plurality of fuel cells connected to the EMM. A central processing unit with an algorithm programmed therein sums up the individual voltages and the sum is subtracted from the total voltage to determine a missing voltage of at least one fuel cell. The EMM has a primary power source and a redundant or alternate power source. The redundant power source is configured to use at least one diode electrically connected to an individual diagnostic connector from the plurality of diagnostic connectors to provide the alternate power source for the EMM. The embedded measurement module also has a primary ground connection and a redundant or alternate ground connection. The redundant ground connection is electrically connected to at least one individual diagnostic connector from the plurality of diagnostic connectors to provide the alternate ground source for the EMM.

BRIEF DESCRIPTION OF THE SEVERAL VIEWS OF THE DRAWINGS

FIG. 3 depicts a comparison between a cell voltage measurement signal including an index synchronization sequence, a saw tooth comparison signal and an output signal.

DETAILED DESCRIPTION

Figure 1:
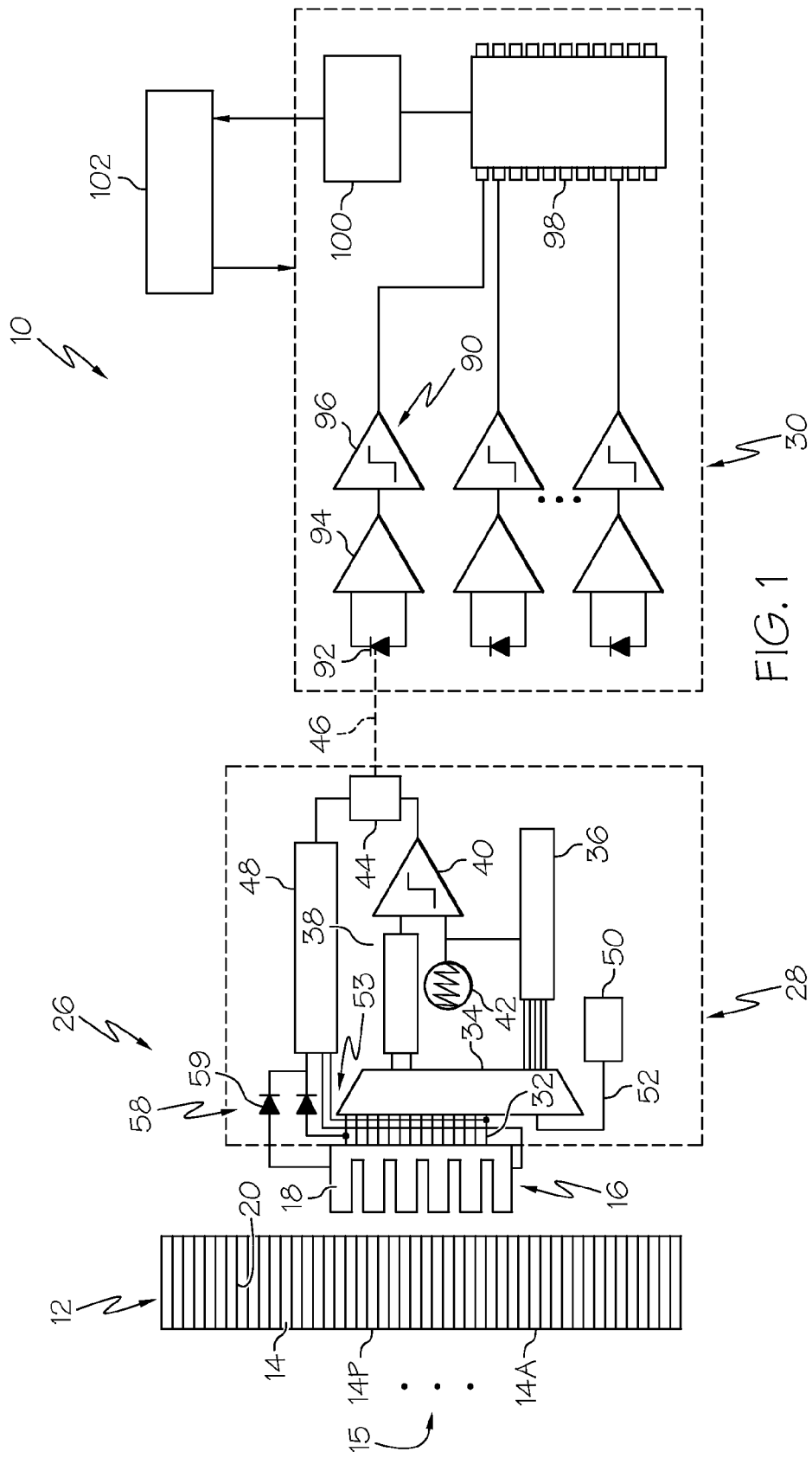
FIG. 1 is a schematic block diagram of a fuel cell system with health monitoring apparatus according to an aspect of the disclosure.

Referring first to FIG. 1, a schematic block diagram of a fuel cell system 10 is shown. The fuel cell system 10 has a fuel cell stack 12, an embedded measurement module (EMM) 26 and a receiver circuit 30. In this non-limiting embodiment, fuel cell stack 12 has a plurality of stacked fuel cells 14. The EMM 26 comprises a stack interconnect 16 having a plurality of diagnostic connectors 18 and a cell voltage monitoring circuit 28. The diagnostic connectors 18 are mounted to a substrate and are in electrical contact with a plurality of bipolar plates 20 that separate the fuel cells 14 in the fuel cell stack 12. In one non-limiting embodiment, the stack interconnect 16 includes twenty diagnostic connectors 18. All twenty diagnostic connectors 18 are in contact with seventeen bipolar plates 20 which define sixteen fuel cells 14. This enables the EMM 26 to monitor the voltage of sixteen fuel cells 14. Those sixteen fuel cells are represented in FIG. 1 as 14A-14P and define a cell group 15. Seventeen of the diagnostic connectors 18 are in contact with seventeen bipolar plates 20. The remaining three diagnostic connectors 18 make redundant connections to three of the seventeen bipolar plates 20. In one embodiment, the stack interconnect 16 is an embedded interconnect that is part of the fuel cell stack 12, although other types of interconnects may be equally applicable.

The EMM 26 is created with a standard twenty diagnostic connectors 18. The architecture of the fuel cell stack 12 encompasses three hundred and twenty fuel cells 14. Using an even twenty EMMs 26 to monitor the fuel cell stack 12, each EMM 26 will monitor sixteen fuel cells 14, leaving three diagnostic connectors 18 on each EMM 26 free for other purposes.

The cell voltage monitoring circuit 28 comprises a communication module 44, a power supply 48, and a pulse generator (discussed in more detail below). The communication module 44 in this non-limited example uses a LED to communicate optically. The communication module 44 may also use electrical or radio frequency to communicate as well.

A power supply 48 provides the electricity needed for the EMM 26 to operate. The EMM 26 derives its power directly from the fuel cell stack 12 through two dedicated connections in the diagnostic connector 18. One connection is for power and the second is for ground. In the preferred embodiment, an alternate power source 58 provides power directly from the fuel cell stack 12 in the event of a connection or component failure. The alternate power source 58 is provided from a redundant diagnostic connector via one of the plurality of leads 32. At least one diode 59 is connected to an individual diagnostic connector from the plurality of diagnostic connectors 18 and at least one diode 59 is connected from one of the plurality of leads 32 to the power supply 48 to create the alternate power source 58. As used throughout this application, the alternate power source 58 is also a redundant power source.

In the preferred embodiment, an alternate ground connection 53 is provided to ensure the EMM 26 has a connection to ground in the event of a connection or component failure. The alternate ground connection 53 is directly connected from the fuel cells 14 via one of the plurality of leads 32. The alternate ground connection is provided from the redundant diagnostic connector and connects directly to the power supply 48. As used throughout this application, the alternate ground connection 53 is also a redundant ground connection.

Another component of the cell voltage monitoring circuit 28 is the pulse generator. The pulse generator comprises a multiplexer 34, an instrumentation amplifier 38, a saw tooth wave generator 42, a counter circuit 36, a comparator 40, and a reference circuit 50. The components of the pulse generator are described in greater detail below.

Figure 2:
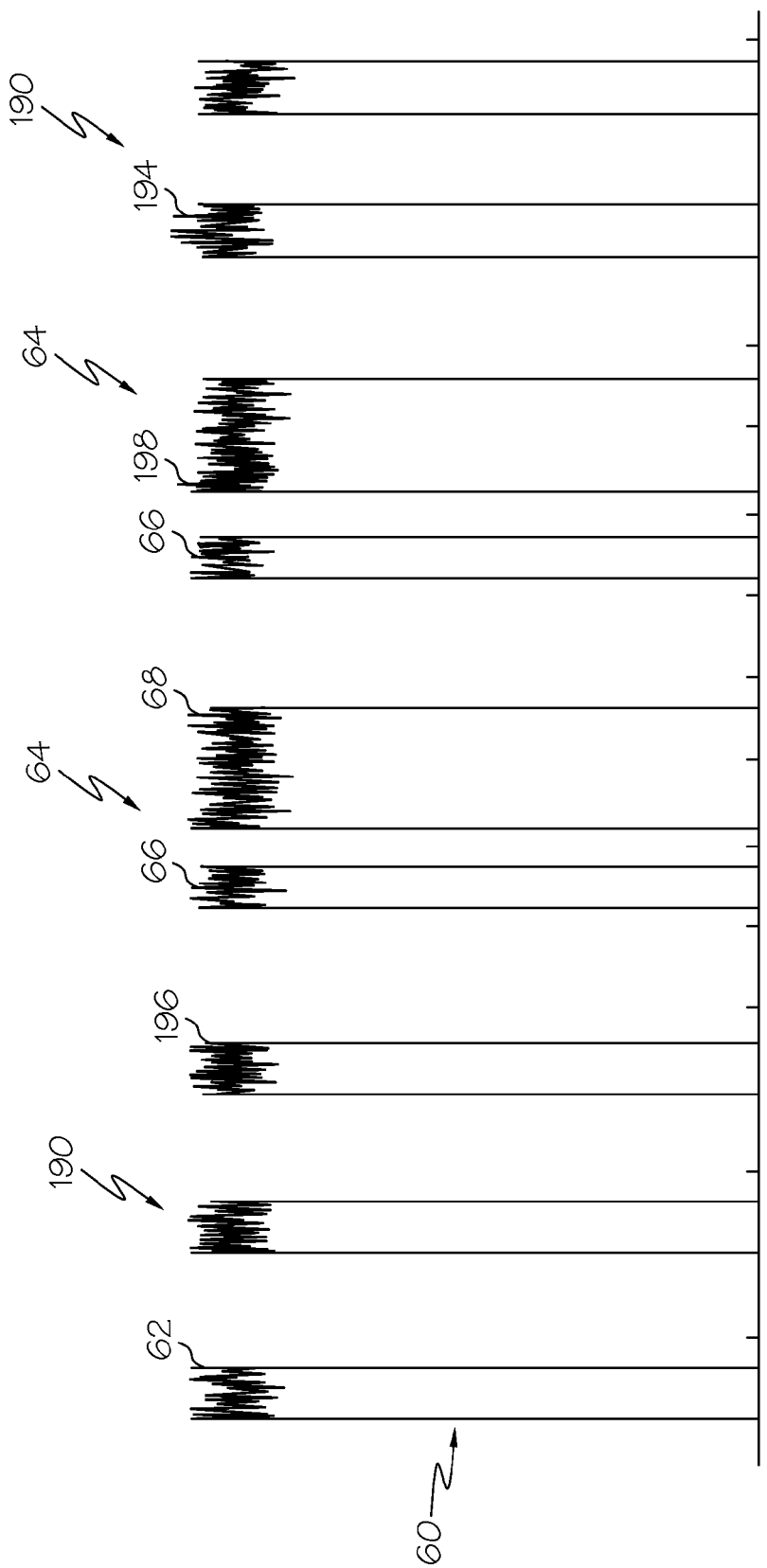
FIG. 2 depicts a PWM signal that includes an index synchronization sequence and cell voltage pulses.

In the cell voltage monitoring circuit 28, the plurality of leads 32 is electrically coupled to each diagnostic connector 18 in the stack interconnect 16. An opposite end of each lead 32 is electrically coupled to the multiplexer 34 that selectively provides two voltage potential signals from the diagnostic connectors 18 to the instrumentation amplifier 38 at any given point in time. The counter circuit 36 provides sequence signals to the multiplexer 34 to cause the multiplexer 34 to selectively and sequentially switch from one of the leads 32 to a next one of the leads 32. The output of the multiplexer 34 is amplified in the instrumentation amplifier 38 such that the signal has a magnitude that identifies the voltage of the particular fuel cell 14 being measured. The amplified cell voltage signal is provided to the comparator 40 that compares the signal to an inverted saw tooth wave provided by the saw tooth wave generator 42, where the output of the comparator 40 is a PWM signal. The PWM signal is shown in FIG. 2. The PWM signal has two parts; a series of end of frame synchronization pulses and a data stream. The width of the pulses in the data stream define a cell voltage as will be discussed in detail below. The PWM signal is provided to the communication module 44 that generates a communication signal 46 having an on/off time determined by the pulses.

The data stream is a sequence of pulses wherein each pulse corresponds to a voltage measurement of each fuel cell 14 in the cell group 15. The end of frame sequence is introduced into the PWM signal after a last fuel cell 14P voltage measurement pulse so that it provides an indication that the next pulse after the end of frame sequence is the voltage measurement pulse for a first fuel cell 14A in the cell group 15. The cell voltage monitoring circuit 28 of the type being discussed sequentially measures the voltage of the plurality of fuel cells 14 in order in a cell group 15. When the voltage of the last fuel cell 14P in the cell group 15 is measured, the sequence returns to the first fuel cell 14A in the cell group 15 and begins to measure the voltage, sequencing through the cell group 15 in this manner at the rate set by the saw tooth wave generator 42.

FIG. 2 is a graph with time on the horizontal axis and magnitude on the vertical axis showing the PWM signal 60 of the type that is output from the comparator 40. The end of frame synchronization pulses 64 provide a reference pattern that when decoded provides an indication that the data stream 190 is next. The first cell in the cell group (refer to FIG. 1) will be the first signal 194 in the data stream 190 after the end of frame synchronization pulses 64 and the last signal 196 corresponding to the last cell in the cell group with end of the data stream 190. The format or pattern of the frame synchronization pulses 64 in this embodiment is a high pulse 66 followed by a low pulse 68, followed by a high pulse 66 and then followed by a last pulse 198 (H-L-H-L). This pattern is specifically selected to provide a defined sequence of the end of frame synchronization pulses 64 that is very unlikely to occur in the actual voltage measurements of the fuel cells shown in FIG. 1, thus providing a good indication that the pulses are the end of frame synchronization pulses 64. In the preferred embodiment, the pulse width of the first three end of frame synchronization pulses 64 (H-L-H) may always be the same for the high pulses 66 and the low pulses 68. The pulse width of the last pulse 198 of the end of frame synchronization pulses 64 may be used to indicate the total voltage of the cell group. The last pulse 198 may not have the same pulse width as the first three pulses 66 and 68. The pulse width of the pulses 62 of the data stream 190 is created by the actual voltage of the fuel cells in the cell group, as will be discussed in detail below.

The width of the end of frame synchronization pulses 64 may be chosen so that the magnitude of the pulse width is known, consistent and outside of any possible pulse width of the data stream 190. In one non-limiting example, the width of the high pulses 66 represents 1.235V and the width of the low pulse 68 represents −1.235V. The modulation provided by the saw tooth wave (FIG. 3) creates the PWM signal 60 so that the high voltage has a narrow pulse width and the low voltage has a wide pulse width.

In the present disclosure, the pulse width of the last pulse 198 of the end of frame synchronization pulses 64 is modified to indicate a total voltage measurement of all the fuel cells in the cell group in FIG. 1. The total voltage measurement is larger in magnitude than any single voltage measurement of the cell group in the data stream 190. The magnitude of a total voltage measurement serves two functions. The first is the traditional function of indicating the end of the data stream 190. The second is an actual, useable total voltage measurement that can be interpreted and used by the electronic control unit (ECU).

The end of frame synchronization pulses 64 can be injected into the PWM signal 60 in any suitable matter. In the fuel cell system 10, the reference circuit 50 generates the sequenced values that become the end of frame synchronization pulses 64. The counter circuit 36 sequences the signals from the reference circuit 50 into the PWM signal 60 after the last fuel cell 14P in the cell group 15 is measured. The total voltage measurement is provided to a series of pins on line 52 to the multiplexer 34 which presents the voltage values in sequence to the instrumentation amplifier 38 and then to the comparator 40. The differentiation between the high pulses 66, the low pulse 68 and the last pulse 198 end of frame synchronization pulses is provided by the modulation using the saw tooth wave 70 shown in FIG. 3 and discussed in more detail below.

The end of frame synchronization pulses 64 allow the voltage measurements to be calibrated, in this non-limiting example, 250 times per second. In other words, the amount of time that the pulse is high is compared to the high pulse 66 to give the voltage measurement that will be less than that value. Because the sequence of the end of frame synchronization pulses 64 represents a start for the data stream 190, and those measurements are taken in the order of the fuel cells 14 in the fuel cell stack 12, each pulse 62 specifically identifies which fuel cell 14 in the cell group 15 being monitored is associated with that pulse 62.

FIG. 3 is a graph with time on the horizontal axis and magnitude on the vertical axis showing a relationship between the inputs to the comparator 40 to provide the modulation of the cell voltage measurement signals and the communication signal 46 that is output from the communication module 44. At the top of FIG. 3, the saw tooth wave 70 from the saw tooth wave generator 42 is shown super-imposed over a voltage signal 72 from the instrumentation amplifier 38. Section 74 of the voltage signal 72 includes four square wave pulses that are the end of frame synchronization pulses provided by the reference circuit 50. When those four square wave pulses are modulated by the saw tooth wave 70, the end of frame synchronization pulses are produced as shown in FIG. 2. The positive portion 76 of the voltage signal 72 will become the narrow width pulses 80 of the communication signal 46 and the negative portion 78 of the voltage signal 72 will become the wide width pulses 82 of the communication signal 46.

In the preferred embodiment, if the saw tooth wave 70 is greater in magnitude than the voltage signal 72, then the comparator outputs a pulse 62, which causes a LED in the communication module to conduct and generate the optical signal. This is shown by the bottom of the graph on FIG. 3 where "1" represents the LED being on and "0" represents the LED being off. Particularly, the angle provided by the saw tooth wave 70 creates the modulation for the width of the pulse being relative to the magnitude of the voltage measurement signal. Therefore, the pulses of the optical signal are narrower for the high voltage than they are for the low voltage. As the magnitude of the voltage pulse 84 goes up, it is covered by a narrower part of the saw tooth wave 70, which creates a narrower pulse in the optical signal. Thus, the greater the magnitude of the voltage pulse 84 represented by a higher voltage of the particular fuel cell being measured, the narrower the pulse for that voltage measurement, which represents a higher voltage.

Referring back to FIG. 1, in the preferred embodiment using optical communication, the receiver circuit 30 includes a series of receiver channels where there is a single channel 90 for each of the EMMs 26. Each channel 90 includes a photodiode 92 that receives the communication signal 46 and a trans-impedance amplifier 94 that converts the diode current to a representative voltage. The voltage signal from the trans-impedance amplifier 94 is then sent to a comparator 96 to make sure it is within a desired range, and if so, is then sent to a master central processing unit (CPU) 98, which receives the signals from all of the channels 90. The CPU 98 decodes the on/off sequence of the voltage signal to identify the end of frame synchronization pulses 64 so that each new group of actual voltage measurement signals are recalibrated to the startup calibration sequence at each measurement. The CPU 98 uses the width of the voltage pulses that have been decoded to identify a minimum cell voltage, a maximum cell voltage, an average cell voltage, and the actual voltage of each cell. This information is provided to a dual controller area network (CAN) 100 that provides the information to a vehicle bus through a serial interface circuit (SIU) 102 and then to a vehicle ECU (not shown) that controls the fuel cell system 10, such as controlling reactant flow rates, stack relative humidity, etc. The edge-to-edge time of the PWM signal 60 does not exceed the capability of the timer capture unit in the CPU 98.

While certain representative embodiments and details have been shown for purposes of illustrating the invention, it will be apparent to those skilled in the art that various changes may be made without departing from the scope of the invention, which is defined in the appended claims. For example the communication between the EMM 26 and the receiver circuit 30 could be done electrically via wires, radio waves or optically as illustrated. Furthermore the substrate can be a printed circuit board.

We claim:

1. A health monitoring system for a fuel cell stack, the system comprising:
    an embedded measurement module comprising:
        a cell voltage monitoring circuit comprising:
            a communication module; and
            a pulse generator configured to send a plurality of pulses and an end of frame sequence to a receiver circuit, each pulse in the plurality of pulses corresponding to an individual voltage for each fuel cell in the fuel cell stack, the end of frame sequence indicating the beginning of the plurality of pulses as well as a total voltage for a plurality of fuel cells connected to the embedded measurement module; and a plurality of diagnostic connectors coupled to a substrate and electrically connected to the plurality of fuel cells; and a central processing unit with an algorithm programmed therein such that the individual voltages for each fuel cell are added up to a sum of the individual voltages that is subtracted from the total voltage to determine a missing voltage of at least one fuel cell.

2. The health monitoring system of claim 1, wherein the communication module communicates with the receiver circuit optically.

3. The health monitoring system of claim 1, wherein the communication module communicates with the receiver circuit electrically.

4. The health monitoring system of claim 1, wherein the communication module communicates with the receiver circuit using radio waves.

5. The health monitoring system of claim 1, wherein the embedded measurement module has an alternative power source using at least one diode electrically connected to an individual diagnostic connector from the plurality of diagnostic connectors.

6. The health monitoring system of claim 1, wherein the embedded measurement module has an alternative ground connection electrically connected to at least one individual diagnostic connector from the plurality of diagnostic connectors.

7. The health monitoring system of claim 1, wherein the substrate is a printed circuit board.

8. A method of redundant health monitoring of a fuel cell stack, the method comprising:
    providing an embedded measurement module comprising a plurality of diagnostic connectors electrically connected with a plurality of fuel cells in the fuel cell stack;
    receiving a plurality of pulses from the embedded measurement module wherein each pulse in the plurality of pulses indicates an individual voltage for an individual fuel cell in the plurality of fuel cells in the fuel cell stack;
    defining an end of frame sequence that indicates the beginning of the plurality of pulses, and a total voltage for the plurality of fuel cells connected to the embedded measurement module; and
    calculating a missing voltage value corresponding to at least one of the fuel cells in the plurality of fuel cells using an algorithm wherein the individual voltage for each fuel cell is added up to a sum of the individual voltages and the sum is subtracted from the total voltage to determine the missing voltage value.

9. The method of claim 8, further comprising receiving the plurality of pulses optically.

10. The method of claim 8, further comprising receiving the plurality of pulses electrically.

11. The method of claim 8, further comprising receiving the plurality of pulses using radio waves.

12. The method of claim 8, further comprising providing an alternative power source to the embedded measurement module through at least one diode electrically connected to an individual diagnostic connector from the plurality of diagnostic connectors.

13. The method of claim 8 further comprising providing an alternative ground connection electrically connected to at least one individual diagnostic connector from the plurality of diagnostic connectors.

14. A redundant health monitoring system for a fuel cell stack, the system comprising:
    an embedded measurement module comprising:
        a plurality of diagnostic connectors coupled to a substrate and electrically connected to a plurality of fuel cells;
        a cell voltage monitoring circuit comprising:
            a communication module configured to communicate with a receiver circuit optically; and
            a pulse generator configured to send a plurality of pulses and an end of frame sequence to the receiver circuit, each pulse in the plurality of pulses corresponding to an individual voltage for each fuel cell in the fuel cell stack, the end of frame sequence indicating the beginning of the plurality of pulses as well as a total voltage for the plurality of fuel cells connected to the embedded measurement module; and
    a central processing unit with an algorithm programmed therein, such that the individual voltages for each fuel cell are added up to a sum of the individual voltages and the sum is subtracted from the total voltage to determine a missing voltage of at least one fuel cell in the event that one of the plurality of diagnostic connectors fails;
    a redundant power source comprising at least one diode electrically connected to at least one individual diagnostic connector from the plurality of diagnostic connectors to provide an alternate power source in the event that a primary power source fails; and
    a redundant ground connection electrically connected to at least one individual diagnostic connector from the plurality of diagnostic connectors to provide an alternate ground connection in the event that one of the plurality of diagnostic connectors fails.

* * * * *